(12) United States Patent
Yan et al.

(10) Patent No.: US 11,425,847 B2
(45) Date of Patent: Aug. 23, 2022

(54) ELECTRO-OPTIC MODULATOR

(71) Applicant: InnoLight Technology (Suzhou) LTD., Jiangsu (CN)

(72) Inventors: Dongdong Yan, Jiangsu (CN); Xianyao Li, Jiangsu (CN)

(73) Assignee: Innolight Technology (Suzhou) Ltd., Suzhou (CN)

( * ) Notice: Subject to any disclaimer, the term of this patent is extended or adjusted under 35 U.S.C. 154(b) by 156 days.

(21) Appl. No.: 17/016,527

(22) Filed: Sep. 10, 2020

(65) Prior Publication Data

US 2021/0084800 A1    Mar. 18, 2021

(30) Foreign Application Priority Data

Sep. 12, 2019 (CN) .......................... 201910866778.3

(51) Int. Cl.
*H05K 9/00* (2006.01)
*G02F 1/01* (2006.01)
*G02F 1/21* (2006.01)

(52) U.S. Cl.
CPC ........... *H05K 9/0081* (2013.01); *G02F 1/011* (2013.01); *G02F 1/21* (2013.01); *G02F 1/212* (2021.01)

(58) Field of Classification Search
None
See application file for complete search history.

(56) References Cited

U.S. PATENT DOCUMENTS

| | | | |
|---|---|---|---|
| 9,739,938 B2 * | 8/2017 | Shi | ......... G02B 6/122 |
| 10,294,844 B2 | 5/2019 | Kissa et al. | |
| 10,739,664 B2 * | 8/2020 | Yan | ......... G02F 1/2255 |
| 2006/0023288 A1 * | 2/2006 | McBrien | ............... G02F 1/0356 359/245 |
| 2016/0033848 A1 | 2/2016 | Kataoka et al. | |
| 2018/0284558 A1 | 10/2018 | Miyazaki et al. | |
| 2018/0358675 A1 * | 12/2018 | Laighton | ................. H01P 3/006 |
| 2020/0249540 A1 * | 8/2020 | Lim | ......... G02F 1/2255 |
| 2021/0084800 A1 * | 3/2021 | Yan | ......... H01L 23/552 |

FOREIGN PATENT DOCUMENTS

| | | |
|---|---|---|
| CN | 105122124 B | 7/2018 |
| CN | 108693664 A | 10/2018 |

* cited by examiner

*Primary Examiner* — Rhonda S Peace
(74) *Attorney, Agent, or Firm* — Finnegan, Henderson, Farabow, Garrett & Dunner, LLP

(57) ABSTRACT

An electro-optic modulator includes a base plate, an optical waveguide, at least one set of modulation electrodes, and an electromagnetic shielding structure. The electromagnetic shielding structure includes a top shielding member covering the set of modulation electrodes from above, and a side shielding member disposed on two sides of the set of modulation electrodes. At least a portion of the side shielding member extends into the base plate to isolate the set of modulation electrodes.

10 Claims, 3 Drawing Sheets

ELECTRO-OPTIC MODULATOR

CROSS-REFERENCE TO RELATED APPLICATION

This application is based upon and claims priority to Chinese Patent Application 201910866778.3, filed on Sep. 12, 2019, the entire content of which is incorporated herein by reference.

FIELD OF THE DISCLOSURE

The present application relates to the field of optical communication technology and, more particularly, to an electro-optic modulator.

BACKGROUND

An optical modulation system is made up of a driver and a modulator. Traveling wave electrode modulators are widely used due to their higher extinction ratio and easiness for integration. Traveling wave electrode modulators are categorized into single-drive and dual-drive by their drive mode, and into series push-pull structure, separate double-arm structure, and other structures by their optical waveguide layout. FIG. 1 is a diagram illustrating a typical traveling wave electrode modulation system 1. As illustrated in FIG. 1, the traveling wave electrode modulation system 1 is primarily made up of a driver 20 and a traveling wave electrode modulator 10. FIG. 2 is a diagram illustrating a cross section of the traveling wave electrode modulator 10 illustrated in FIG. 1.

In the traveling wave electrode modulation system 1, the driver 20 is connected to the traveling wave electrode modulator 10 by means of wire bonding. Optical waveguides 130 are placed in an electric field of modulation electrodes 120. A high-speed digital signal outputted at the driver 20 reaches the traveling wave electrode modulator 10 and is transmitted along the modulation electrodes 120. An optical wave is transmitted along the optical waveguides 130. A change of the electric field caused by the high-speed digital signal in the modulation electrodes 120 will cause a change in an effective refractive index of the optical waveguides 130. Therefore, when the high-speed digital signal is transmitted along the modulation electrodes 120, the electric field of the high-speed digital signal causes the refractive index of the optical waveguides 130 to change and thereby changes the phase of the optical wave, causing the optical wave to carry information from the digital signal. The optical wave interferes in a Mach-Zehnder interferometer at a rear end and thereby completes modulation.

In actual use, an entire traveling wave electrode modulator chip typically has a complete set of four, eight, or more channels. The more channels, the smaller the distance between the channels, and crosstalk will occur between the channels. FIG. 3 illustrates electromagnetic field radiation inside the traveling wave electrode modulator 10 when in use. An electro-optic modulator is installed on a heat sink, e.g., provided as a heat sink pad. The heat sink pad is disposed below a base plate 110 of the traveling wave electrode modulator chip. The heat sink pad is a metal pad and also serves as a metal ground layer 30. An electromagnetic field 150 of a signal electrode 121 will radiate into free space, which will lead to the problem of electromagnetic radiation. A portion of the electromagnetic field 150 will also couple to adjacent channels and cause crosstalk, which will cause the signal to produce noise and eventually affect a symbol error rate of a link. In addition, a common-mode voltage outputted by the driver 20 will cause relatively high electromagnetic radiation from the modulation electrodes 120 near the modulator chip, resulting in problems such as module authentication failure.

SUMMARY

Purposes of the present disclosure include providing an electro-optic modulator having an electromagnetic shielding structure, which can effectively isolate crosstalk between channels on the electro-optic modulator and, at the same time, solving the problem of high electromagnetic radiation from a traveling wave electrode.

In order to achieve one or more aspects of the aforementioned purposes, one embodiment of the present disclosure provides an electro-optic modulator, including a base plate, at least one set of modulation electrodes, and an optical waveguide disposed in the base plate.

The at least one set of modulation electrodes includes at least one signal electrode and one ground electrode. The signal electrode is configured to transmit an electrical signal, the electrical signal being configured to modulate an optical signal transmitted along the optical waveguide.

The electro-optic modulator further includes an electromagnetic shielding structure. The electromagnetic shielding structure includes a top shielding member covering the at least one set of modulation electrodes from above, and a side shielding member disposed on two sides of the set of modulation electrodes. At least a portion of the side shielding member extends into the base plate to isolate the at least one set of modulation electrodes.

DETAILED DESCRIPTION

Figure 1:
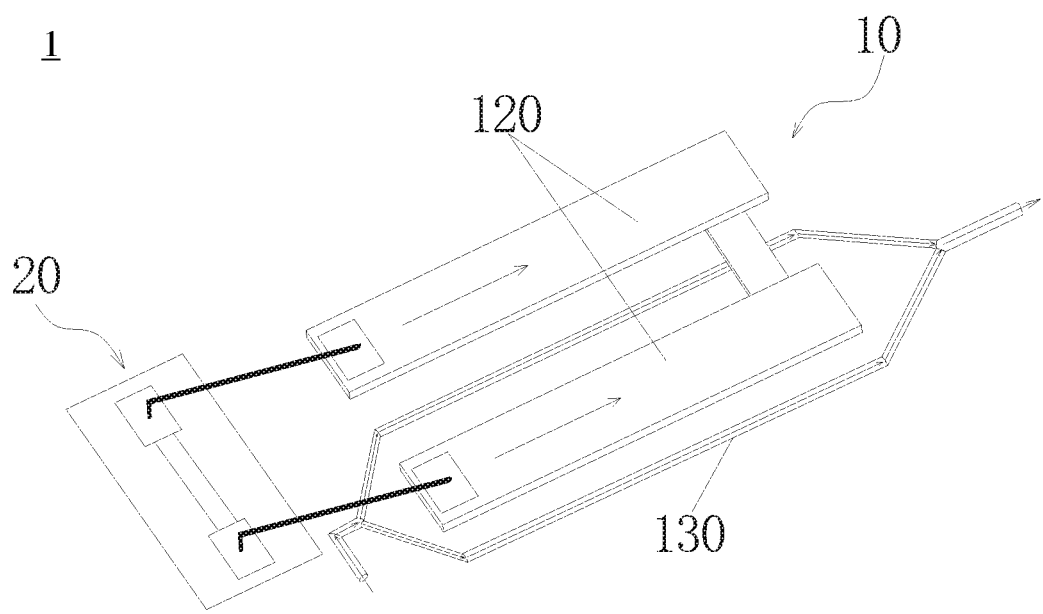
FIG. 1 is a diagram illustrating a traveling wave electrode modulation system.
Figure 2:
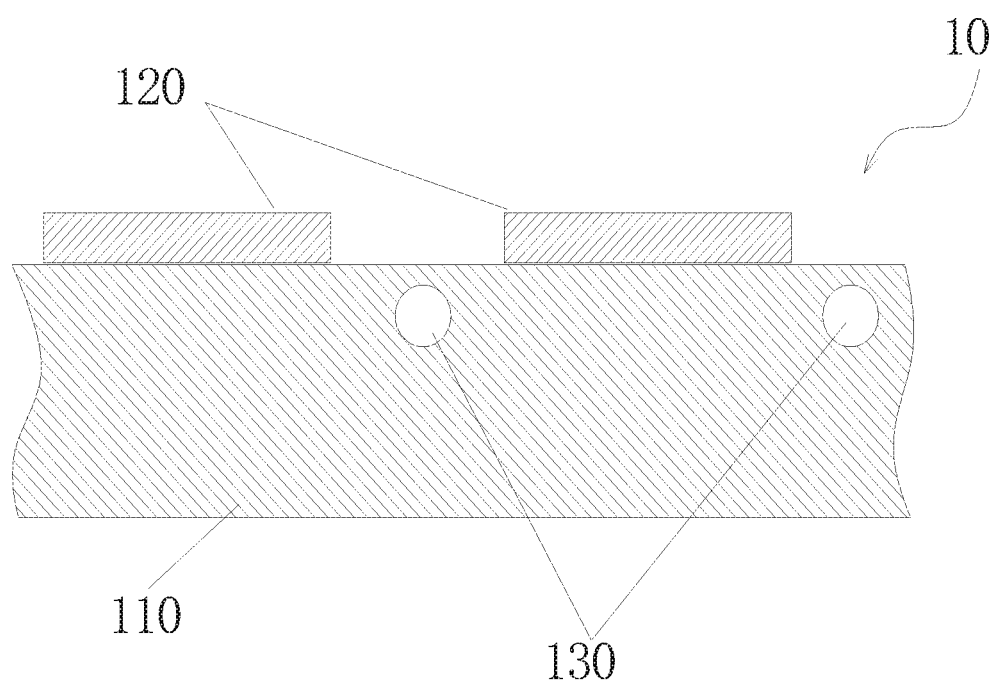
FIG. 2 is a diagram illustrating a cross section of a traveling wave electrode modulator.
Figure 3:
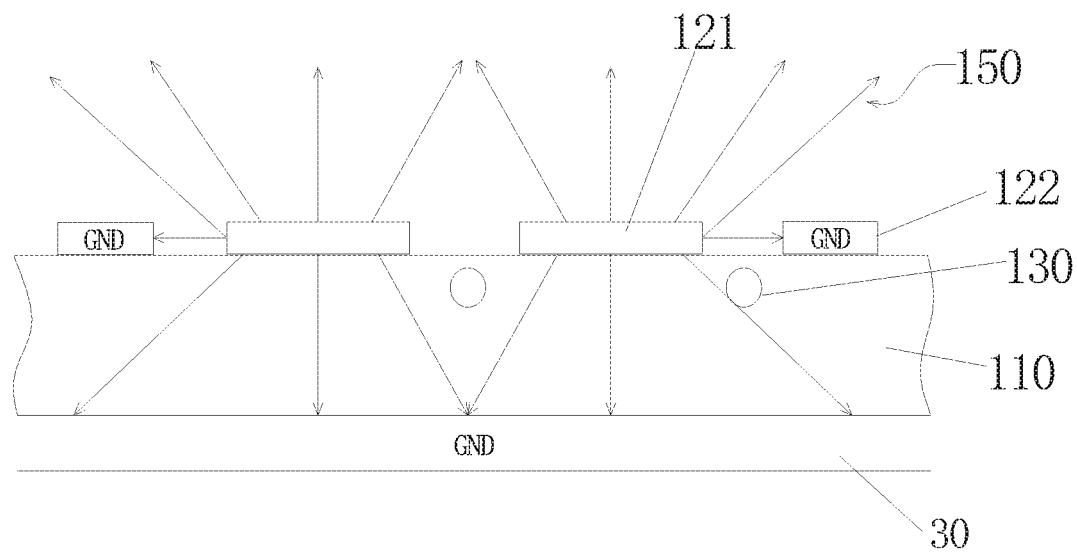
FIG. 3 is a diagram illustrating an electromagnetic field inside a traveling wave electrode modulator.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions. Therefore, the drawings in the present application are only for the purpose of illustrating the basic structure of the subject matter of the present application.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

First Embodiment

Figure 4:
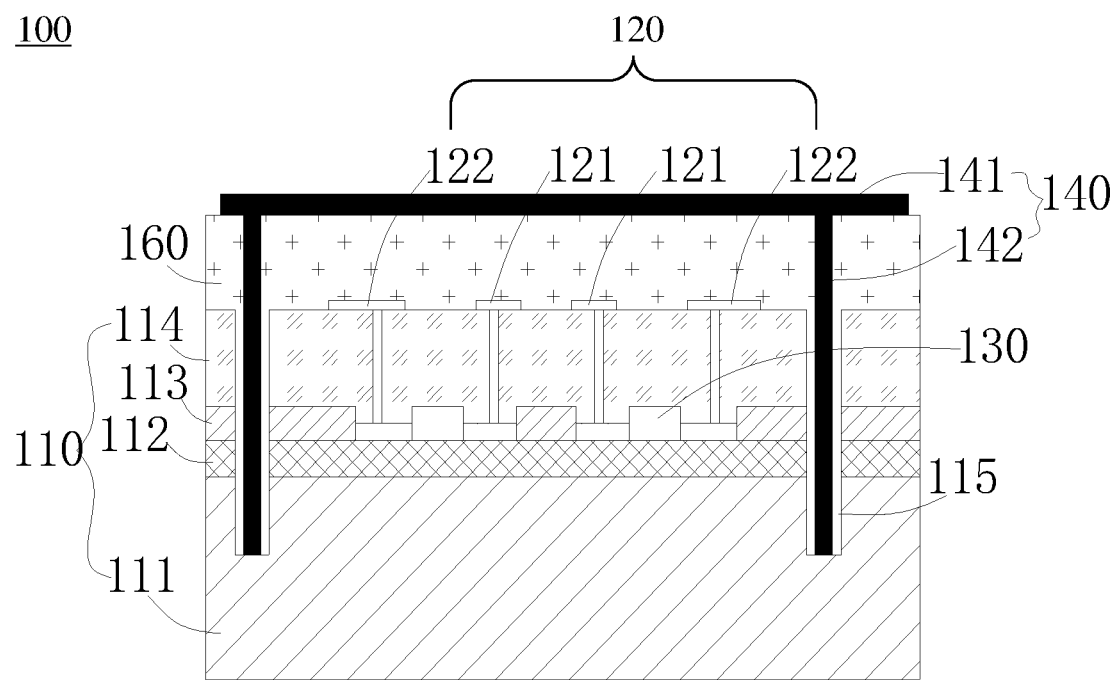
FIG. 4 is a structural diagram illustrating an electro-optic modulator according to a first embodiment of the present disclosure.

FIG. 4 is a structural diagram illustrating an electro-optic modulator 100 according to a first embodiment of the present disclosure. As illustrated in FIG. 4, the electro-optic modulator 100 according to the first embodiment includes a base plate 110, a set of modulation electrodes 120, optical waveguides 130 disposed in the base plate 110, and an electromagnetic shielding structure 140. Here, the set of modulation electrodes 120 are GSSG (ground-signal-signal-ground) traveling wave electrodes including two ground electrodes 122 and two signal electrodes 121. The signal electrodes 121 are configured to transmit electrical signals, and the electrical signals are configured to modulate optical signals transmitted along the optical waveguides 130. The electromagnetic shielding structure 140 includes a top shielding member 141 covering the set of modulation electrodes 120 from above, and a side shielding member 142 disposed on two sides of the set of modulation electrodes 120. At least a portion of the side shielding member 142 extends deep into the base plate 110 to isolate two adjacent sets of modulation electrodes 120 from each other. In the first embodiment, the base plate 110 employs a silicon-on-insulator (SOI) structure, including a substrate layer 111, an insulation layer 112, and a silicon top-layer 113. The optical waveguides 130 are located at the silicon top-layer 113. That is, the optical waveguides 130 and contact areas on two sides thereof are manufactured from the silicon top-layer 113 using a semiconductor technology such as etching or ion implantation. A first dielectric layer 114 and electrically conductive vias 116 are formed on the silicon top-layer 113 by alternately depositing a metal and a dielectric material. Finally, the modulation electrodes 120 are formed by depositing a metal. The ground electrodes 122 and the signal electrodes 121 of the modulation electrodes 120 are electrically connected, respectively, to the contact areas on the two sides of the optical waveguides 130 by means of the electrically conductive vias 116.

In the first embodiment, the side shielding member 142 of the electromagnetic shielding structure 140 extends deep into the substrate layer 111, and the top shielding member 141 or the side shielding member 142 of the electric electromagnetic shielding structure 140 are electrically connected to the ground electrodes 122. For example, gold wires, electrically conductive vias, or another means may be employed to establish an electrical connection between the electromagnetic shielding structure 140 and the ground electrodes 122. The top shielding member 141 of the electromagnetic shielding structure 140 includes a top plate, and the side shielding member 142 includes two vertical plates disposed respectively on the two sides of the set of modulation electrodes 120. The two vertical plates and the top plate are secured and connected together to form a shielding cover whose cross section has an "n"-like shape, covering the modulation electrodes 120 and the corresponding optical waveguides 130. The two vertical plates extend deep into the substrate layer 111, shielding not only electromagnetic radiation in the vicinity of the modulation electrodes 120 but also electromagnetic radiation that enters into the substrate layer 111, thereby solving the problem of high electromagnetic radiation from the modulation electrodes 120, providing a better shielding effect against electromagnetic radiation between two adjacent sets of modulation electrodes 120, and enabling greater effectiveness in reducing crosstalk between adjacent channels. The top plate and the vertical plates are all metal plates, such as copper plates or aluminum plates. The top plate and the vertical plates may be secured together by means of welding, or may be formed as a one-piece structure by means of a metal processing technology such as die casting. In a manufacturing process, a deep silicon via (DSV) technology may be used to manufacture deep silicon vias 115 in the base plate 110, thus forming holes of approximately 100 μm to 200 μm in the substrate layer 111. Then the side shielding member 142 of the electromagnetic shielding structure 140 is inserted into these holes and adhered and secured by an adhesive agent, such as glue, to stop an electromagnetic wave from radiating to the outside, thus providing a shielding effect against electromagnetic radiation.

In order to further improve the modulation bandwidth and modulation performance of the electro-optic modulator 100, in the first embodiment, between the electromagnetic shielding structure 140 and the modulation electrodes 120 there is a dielectric material with a suitable dielectric constant, i.e., a second dielectric layer 160, so that the effective dielectric constant of the dielectric material around the modulation electrodes 120 matches the effective refractive index of the optical waveguides 130, thereby causing the transmission speed of an electromagnetic wave transmitted along the modulation electrodes 120 to be the same as the transmission speed of an optical wave transmitted along the optical waveguides 130, thus achieving a full match and avoiding the problem of restricted modulation bandwidth caused by a mismatch between the transmission speeds of the electromagnetic wave and the optical wave. For example, under typical conditions, the effective dielectric constant of the modulation electrodes 120 is low. Therefore, the transmission speed of the electromagnetic wave is higher than the transmission speed of the optical wave that needs to be modulated, resulting in a mismatch between the electromagnetic wave and the optical wave. In this situation, a dielectric material with a higher dielectric constant may be selected to fill the space between the modulation electrodes 120 and the electromagnetic shielding structure 140 to form the second dielectric layer 160, to increase the effective dielectric constant around the modulation electrodes 120, thereby causing the transmission speed of the electromagnetic wave to be completely the same as the transmission speed of the optical wave so that they fully match, thus improving the modulation bandwidth and modulation performance of the electro-optic modulator 100. The aforementioned dielectric material is a material with a higher dielectric constant, such as silicon dioxide, monocrystalline silicon, polycrystalline silicon, ceramic, or aluminum oxide. The dielectric material may be deposited or grown on the modulation electrodes 120 with a semiconductor technology, or adhered onto the modulation electrodes 120 by means of a dielectric glue.

Second Embodiment

Figure 5:
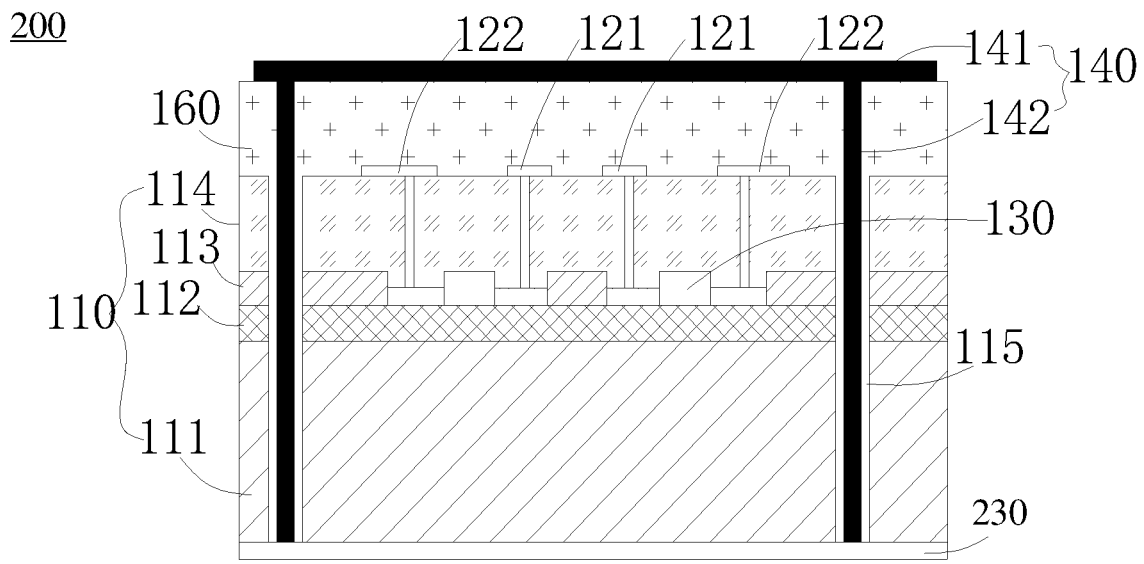
FIG. 5 is a structural diagram illustrating an electro-optic modulator according to a second embodiment of the present disclosure.

FIG. 5 is a structural diagram illustrating an electro-optic modulator 200 according to a second embodiment of the present disclosure. As illustrated in FIG. 5, the second embodiment differs from the first embodiment in that the side shielding member 142 of the electromagnetic shielding structure 140 extends from a top surface to a bottom surface of the substrate layer 111. A metal ground layer 230 is disposed at the bottom of the substrate layer 111, and the side shielding member 142 extends through the substrate layer 111 and is electrically connected to the metal ground layer 230. The side shielding member 142 extends through the substrate layer 111 and is capable of completely stopping an electromagnetic wave in the substrate layer 111 from radiating to the outside, further improving the electromagnetic shielding effect. In a manufacturing process, a through silicon via (TSV) technology may be used to manufacture through holes 115 extending through the entire base plate 110 of the electro-optic modulator 200. Then the side shielding member 142 of the electromagnetic shielding structure 140 is inserted into these holes to provide a shielding effect against electromagnetic radiation and effectively eliminate crosstalk between channels. The electromagnetic shielding structure 140 is electrically connected to the metal ground layer 230 at the bottom by means of contact between the side shielding member 140 and the metal ground layer 230, thereby establishing a connection to the ground and resulting in a simpler link.

Third Embodiment

Figure 6:
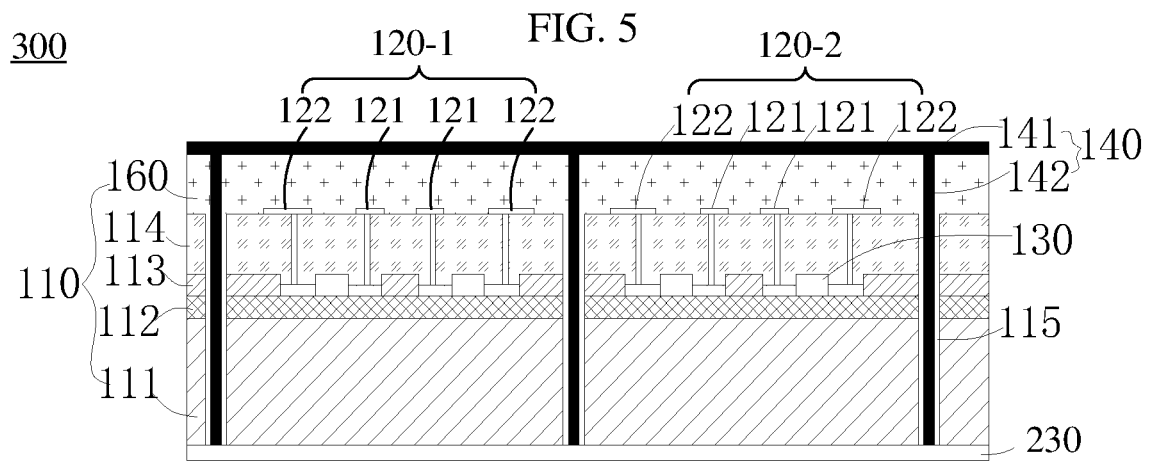
FIG. 6 is a structural diagram illustrating an electro-optic modulator according to a third embodiment of the present disclosure.

FIG. 6 is a structural diagram illustrating an electro-optic modulator 300 according to a third embodiment of the present disclosure. As illustrated in FIG. 6, in the third embodiment, the electromagnetic shielding structures 140 of a plurality of sets of modulation electrodes (FIG. 6 illustrates two sets of modulation electrodes 120-1 and 120-2 as an example) may be made as a single structure on the basis of the first or the second embodiment for the electro-optic modulator 300 having the plurality of sets of modulation electrodes 120-1 and 120-2. Specifically, the top shielding member 141 of the electromagnetic shielding structure 140 of the plurality of modulation electrodes 120-1 and 120-2 includes a top plate. The side shielding member 142 includes a plurality of vertical plates. Each vertical plate is disposed between each adjacent sets of modulation electrodes 120-1 and 120-2. The plurality of vertical plates and the top plate are secured and connected together to form a structure whose cross section is a plurality of "n"-like shapes connected together. Or, the plurality of vertical plates and the top plate are formed as a one-piece structure whose cross section is a plurality of "n"-like shapes connected together. For example, in a commonly used four-channel or eight-channel electro-optic modulator, the electromagnetic shielding structures of all channels are made as a single structure, resulting in a tighter structure that saves space and simplifies the manufacturing process.

Fourth Embodiment

Figure 7:
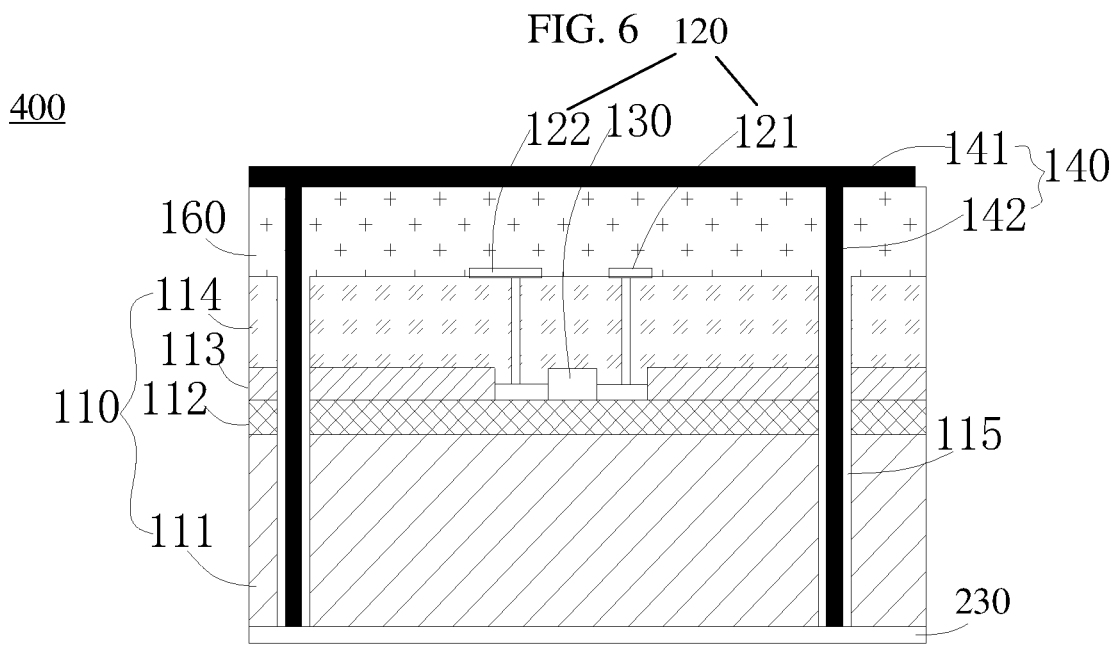
FIG. 7 is a structural diagram illustrating an electro-optic modulator according to a fourth embodiment of the present disclosure.

FIG. 7 is a structural diagram illustrating an electro-optic modulator 400 according to the fourth embodiment of the present disclosure. As illustrated in FIG. 7, the fourth embodiment differs from all of the aforementioned embodiments in that the set of modulation electrodes 120 is GS (ground-signal) traveling wave electrodes including one signal electrode 121 and one ground electrode 122. All other structures may be the same as those according to any one of the aforementioned embodiments; details will not be repeated here. In other embodiments, the modulation electrodes 120 may alternatively be GSG (ground-signal-ground) traveling wave electrodes including one signal electrode and two ground electrodes, a "T" rails traveling wave electrode, or an electrode of another structure.

Embodiments of the present disclosure provide the following benefits. The addition of the electromagnetic shielding structure 140 can effectively isolate crosstalk between channels on the electro-optic modulator 100, 200, 300, or 400, and shield electromagnetic radiation from the modulation electrodes 120, thus solving the problem of high electromagnetic radiation from the modulation electrodes 120. A dielectric material with a suitable dielectric constant is filled between the electromagnetic shielding structure 140 and the modulation electrodes 120 so that the effective dielectric constant of the dielectric material around the modulation electrodes 120 matches the effective refractive index of the optical waveguide 130, thereby causing the transmission speed of an electromagnetic wave to be the same as the transmission speed of an optical wave, thus achieving a full match in order to improve the modulation bandwidth and modulation performance of the electro-optic modulator 100, 200, 300, or 400.

The series of detailed descriptions above is only intended to provide specific descriptions of feasible embodiments of the present disclosure. They are not to be construed as limiting the scope of protection for the present disclosure; all equivalent embodiments or changes that are not detached from the technology of the present disclosure in essence should fall under the scope of protection of the present disclosure.

What is claimed is:

1. An electro-optic modulator, comprising:
a base plate;
at least one set of modulation electrodes; and
an optical waveguide disposed in the base plate,
the at least one set of modulation electrodes comprising at least one signal electrode and at least one ground electrode, the signal electrode being configured to transmit an electrical signal, the electrical signal being configured to modulate an optical signal transmitted along the optical waveguide,
wherein
the electro-optic modulator further comprises an electromagnetic shielding structure,
the electromagnetic shielding structure comprises a top shielding member covering the at least one set of modulation electrodes from above, and a side shielding member disposed on two sides of the set of modulation electrodes, and
at least a portion of the side shielding member extends into the base plate to isolate the at least one set of modulation electrodes.

2. The electro-optic modulator of claim 1, wherein the base plate comprises a substrate layer, an insulation layer, and a silicon top-layer, the optical waveguide being located at the silicon top-layer, and
the side shielding member extends into the substrate layer.

3. The electro-optic modulator of claim 2, wherein the side shielding member extends from a top surface to a bottom surface of the substrate layer.

4. The electro-optic modulator of claim 3, wherein a metal ground layer is disposed at the bottom of the substrate layer, and the side shielding member extends through the substrate layer and is electrically connected to the metal ground layer.

5. The electro-optic modulator of claim 1, wherein the electromagnetic shielding structure is electrically connected to the ground electrode.

6. The electro-optic modulator of claim 1, wherein the top shielding member comprises a top plate, the side shielding member comprises a plurality of vertical plates, each of the plurality of vertical plates being disposed at a side of the at least one set of modulation electrodes, and the plurality of vertical plates and the top plate are connected together to form a structure whose cross section is an "n"-like shape, or, plurality of vertical plates and the top plate are formed as a one-piece structure whose cross section is an "n"-like shapes.

7. The electro-optic modulator of claim 6, wherein the top plate and the vertical plates are all metal plates.

8. The electro-optic modulator of claim 1, wherein the set of modulation electrodes includes GS (ground-signal) electrodes, GSG (ground-signal-ground) electrodes, or GSSG (ground-signal-signal-ground) electrodes.

9. The electro-optic modulator of claim 1, wherein a dielectric layer is disposed between the modulation electrodes and the top shielding member.

10. The electro-optic modulator of claim 9, wherein the dielectric material of the dielectric layer has an effective dielectric constant that causes the speed of an electromagnetic wave transmitted along the modulation electrodes and the speed of an optical wave transmitted along the optical waveguide to match.

* * * * *

UNITED STATES PATENT AND TRADEMARK OFFICE
CERTIFICATE OF CORRECTION

PATENT NO. : 11,425,847 B2
APPLICATION NO. : 17/016527
DATED : August 23, 2022
INVENTOR(S) : Dongdong Yan et al.

It is certified that error appears in the above-identified patent and that said Letters Patent is hereby corrected as shown below:

On the Title Page

Item (71), in the Applicant, Line 2, "Jiangsu (CN)" should read --Suzhou (CN)--.

Item (72), in the Inventors, Lines 1-2,
"Dongdong Yan, Jiangsu (CN); Xianyao Li, Jiangsu (CN)" should read
--Dongdong Yan, Suzhou (CN); Xianyao Li, Suzhou (CN)--.

Item (73), in the Assignee, Line 1, "Innolight" should read --InnoLight--.

In the Claims

In Claim 6, Column 8, Line 1, "plurality of vertical plates" should read --the plurality of vertical plates--.

In Claim 6, Column 8, Lines 2-3, "is an "n"-like shapes." should read --is an "n"-like shape.--.

Signed and Sealed this
Eleventh Day of October, 2022

Katherine Kelly Vidal
*Director of the United States Patent and Trademark Office*